United States Patent [19]

Ferber et al.

[11] Patent Number: 4,679,162
[45] Date of Patent: Jul. 7, 1987

[54] WIDE DYNAMIC RANGE LINEAR TO LOG CONVERTER WITH MICROCOMPUTER CONTROL

[75] Inventors: Alan C. Ferber, Hillside; Morteza M. Chamran, deceased, late of Elmhurst, both of Ill., by Delories M. Chamran, executrix

[73] Assignee: Perkin-Elmer Corp., Norwalk, Conn.

[21] Appl. No.: 651,190

[22] Filed: Sep. 14, 1984

[51] Int. Cl.4 .......................... G06F 7/02; H03M 1/06
[52] U.S. Cl. ............................ 364/571; 340/347 AD; 340/347 CC; 364/570; 367/67
[58] Field of Search ............... 364/498, 570, 571, 577; 340/347, 347 CC, 347 AD; 367/65, 66, 67; 330/278, 279, 289

[56] References Cited

U.S. PATENT DOCUMENTS

| | | | |
|---|---|---|---|
| 3,027,079 | 3/1962 | Fletcher et al. | 340/347 CC |
| 3,525,948 | 8/1970 | Sherer et al. | 367/65 |
| 4,016,557 | 4/1977 | Zitelli et al. | 367/67 |
| 4,045,746 | 8/1977 | Wheatley, Jr. | 330/289 |
| 4,050,065 | 9/1977 | Mosley et al. | 340/347 NT |
| 4,194,163 | 3/1980 | Gillespie | 330/86 |
| 4,300,203 | 11/1981 | Brown | 364/577 |
| 4,357,600 | 11/1982 | Ressmeyer et al. | 340/347 NT |
| 4,364,028 | 12/1982 | Masuda et al. | 340/347 NT |
| 4,383,247 | 5/1983 | Assard | 367/67 |
| 4,490,713 | 12/1984 | Mrozowski | 340/347 AD |
| 4,494,212 | 1/1985 | Muellner | 364/571 |

Primary Examiner—Errol A. Krass
Assistant Examiner—Daniel W. Juffernbruch
Attorney, Agent, or Firm—Edwin T. Grimes; Francis L. Masselle

[57] ABSTRACT

The effective range of an analog linear-log converter is extended above the number of output decades over which this converter is reasonably linear to cover several additional decades of log conversion. This is made possible by adding a variable gain amplifier having several decades of switchable gain to the input of the converter. Switching between decades to utilize the added decades of output is controlled by a microcomputer which monitors the output level. This switching restores the signal level of each of the added decades to the same level as that of an earlier decade thus maintaining the same slope accuracy and noise levels of the earlier decades throughout the whole conversion range. The microcomputer also provides slope corrections from a lookup table for each of the different output decades as well as also applying to the output corrections for offsets due to the circuit components. Ambient temperature compensation is also provided following the linear-log converter for increased precision.

10 Claims, 1 Drawing Figure

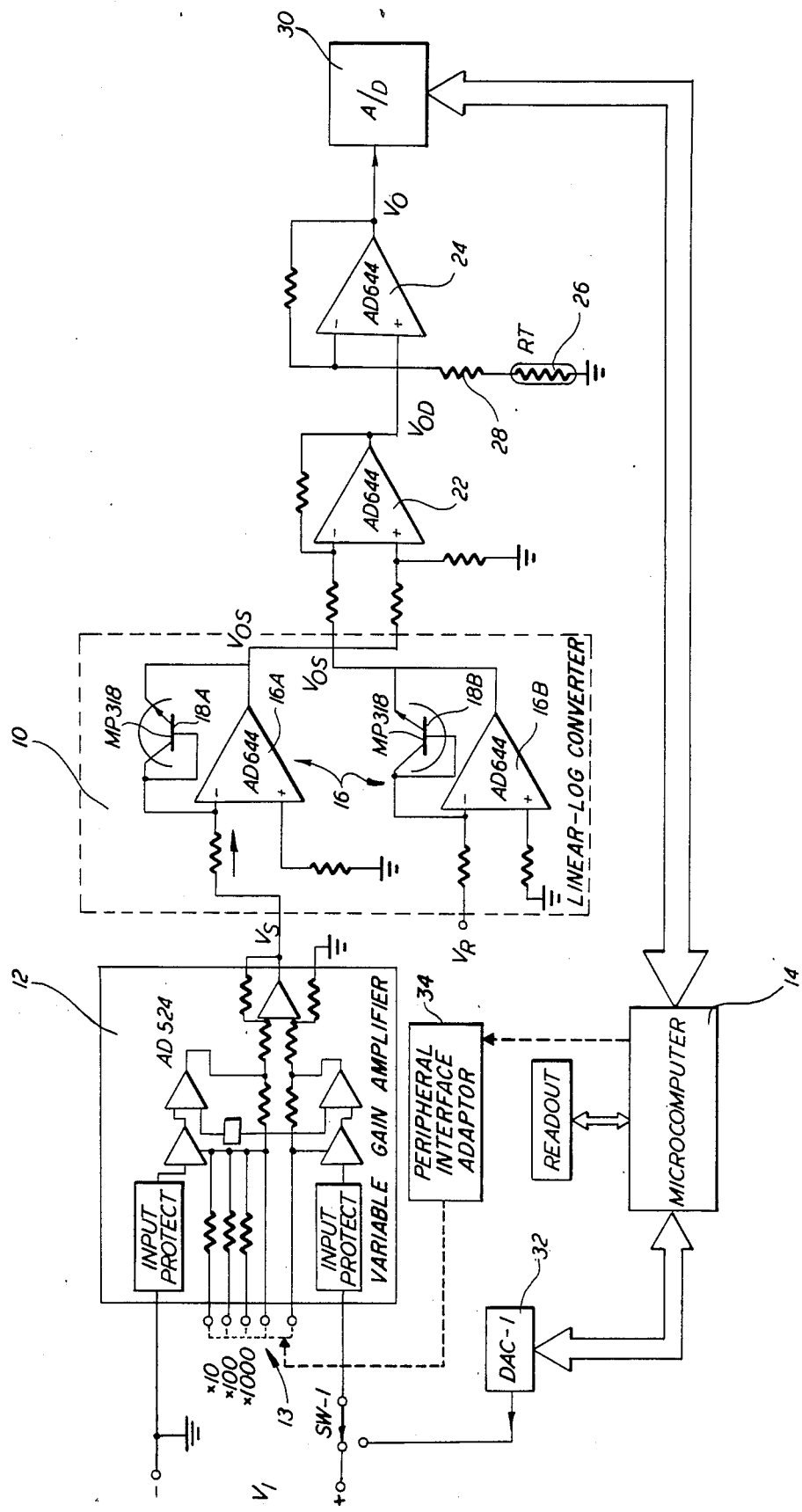

WIDE DYNAMIC RANGE LINEAR TO LOG CONVERTER WITH MICROCOMPUTER CONTROL

BACKGROUND OF THE INVENTION

The linear-log converter in its analog form has been extensively used in spectrophotometry for absorbance measurements. In this form advantage is taken of the logarithmic characteristics of the base-emitter junction of a transistor used in the feedback link of an operational amplifier to convert a linear amplifier input into a log output. However, a range of over two decades of input begins to see deviation from the log characteristic.

With modern spectrophotometers using holographic gratings and much reduced stray light a wider log, i.e. absorbance, output is essential. Digital performance of the linear-log conversion is limited by digitation noise in the analog to digital converter.

BRIEF DESCRIPTION OF THE INVENTION

According to the invention there is provided a ratiometric linear to log converter with a preselectable dynamic range of up to 7 absorbance units having excellent conformity. This system utilizes state of the art solid state technology and the power of the microprocessor for all the required adjustments and data manipulations. It also eliminates the need for a high resolution A/D converter for higher performance instruments. At this time the 16 bit resolution A/D converter has the highest resolution that has been used on these sophisticated instruments. At 16 bits resolution for an A/D converter a digital noise of 0.0065 absorbance is expected at 3.0 absorbance. Increasing the resolution beyond 16 bits is very costly.

Utilizing the described system of this invention, a resolution of only 12 to 14 bits will be required to perform measurements of up to 7 decades absorbance.

It is an object of this invention to combine state of the art analog electronics with the power of a microcomputer to provide a wider linear to log conversion range than is possible with either analog or digital conversion alone.

It is a further object of this invention to provide, through microcomputer control, automatic calibration and linearity correction.

It is yet a further objective to minimize quantization noise at high absorbance values.

It is a still further objective to eliminate the need for a high resolution, expensive A/D converter.

It is also an object to accomplish the above while still providing a fast conversion.

The system comprises a programmable gain instrumentation amplifier followed by a linear to log converter. The output of the linear to log converter, after further amplification, is delivered through an A/D converter to a microcomputer for data processing. Over the highest two decades of input signal the gain of the programmable gain amplifier is set at unity. On entering the next lower input decade the microcomputer responds by increasing the amplifier gain to 10 and revising the output signal to the next higher decade of absorbance. The same procedure takes place on entering each of the next lower decades of input, the gain of the amplifier becoming 100 and 1000, respectively. Corrections are made in each decade for any change of slope of the conversion function. By this procedure a range of five decades can be covered; the lower three being under the control of the microcomputer. If desired this procedure can be further extended to six or seven decades. Furthermore, the microcomputer also may be used to initially calibrate the system, determining automatically and then storing corrections for offsets and slope variation from decade to decade. In this way a high degree of correction for the linear to log conversion is attained.

There has thus been outlined rather broadly the more important features of the invention in order that the detailed description thereof that follows may be better understood, and in order that the present contribution to the art may better appreciated. There are, of course, additional features of the invention that will be described more fully hereinafter. Those skilled in the art will appreciate that the conception on which this disclosure is based may readily be utilized as the basis of the designing of other apparatus for carrying out the various purposes of the invention. It is important, therefore, that this disclosure be regarded as including such equivalent apparatus as do not depart from the spirit and scope of the invention.

BRIEF DESCRIPTION OF THE DRAWING

The FIGURE shows a simplified schematic drawing of the circuit according to the invention.

DETAILED DESCRIPTION OF THE PRESENTLY PREFERRED EMBODIMENT

Referring to the FIGURE, input Vi to the system is applied through a variable gain instrumentation amplifier 12, which may accept either a single-ended input or two variable inputs. In the preferred embodiment Analog Devices AD524 is used although equivalent amplifiers may alternatively be used. In this type of amplifier, gain is programmable by connecting together selected pins as indicated at 13. These connections may be made, as will be evident to one skilled in the art, by digital switching devices, relays, or gates connected to pins 13 controlled from the microcomputer unit (MPU) 14 through suitable peripheral interface adaptors 34. The gain of amplifier 12 can be set at unity, x10, x100 or x1000, for example. All the resistors for gain control are part of the same substrate as the amplifier proper for maximum accuracy and temperature tracking.

A linear-log conversion amplifier 10 is provided which includes a dual operational amplifier 16. The data output Vs of variable gain amplifier 12 is directed to the input of one half 16A of the dual operational amplifier 16. Since both halves of this dual amplifier are in the same housing all temperature sensitive characteristics will be alike for both. The amplifier used in the illustrated embodiment is a AD644, Analog Devices, although other dual amplifiers, presenting a similar very low zero offset voltage, low temperature drift and low input bias current, may be used. The second half of this dual amplifier 16B receives its input from a reference voltage $V_R$. In the feedback of each half of amplifier 16 is connected one-half 18A and 18B of a dual transistor. For example, the transistors used in this embodiment are Motorola MP318, silicon planar transistors having very high DC gain, low ohmic resistance and matched parameters. When connected as shown the base to emitter junction exhibits a characteristic logarithmic relationship between voltage and current. The two transistors being in the same mount are maintained both at the same temperature. The output $V_{os}$ of each half of this linear-log conversion amplifier 10 will have a logarithmic relationship to linear input voltage changes.

To eliminate initial offset voltages a difference amplifier 22, also AD644, follows and accepts the outputs of amplifier 10. This amplifier is connected for unity gain whereas the following output amplifier 24 has a fixed gain. The output of the data half of the log amplifier 16A is connected to the positive, non-inverting terminal of amplifier 22 and the output of amplifier 22 is similarly connected to the input of amplifier 24. The output of the reference log amplifier 16B is connected to the inverting input of amplifier 22. Since both amplifiers 16A and 16B are on the same substrate, the zero offset and other temperature characteristics of both will be equalized; hence, only the log signal output will be left after the output of amplifier 16B is subtracted from the output of amplifier 16A by the difference amplifier 22.

The theory of linear to logarithmic conversion by using a transistor as a trans-diode in the closed feedback loop of an operational amplifier is well known in the art and need not be discussed in detail here. It can be shown that the output voltage $V_{OD}$ of the difference amplifier 22 equals $E_T \log (I_S/I_R)$, where $I_S$ is the input current to amplifier 16A, and $I_R$ is the input current to amplifier 16B. $E_T = KT/q$, where K is Boltzmann's constant, T is absolute temperature in Kelvins, q is the charge on an electron. A change in ambient temperature will cause an output change of 0.3 percent per degree C. To compensate for this change, the gain of the last stage 24 is varied inversely to the temperature by using a silicon resistor 26 of positive temperature coefficient of 0.7 percent per degree C. in series with a suitable resistor 28 in the inverting input leg of amplifier 24.

The output $V_o$ of amplifier 24, corrected for temperature, is applied to an A/D converter 30. In the illustrated embodiment any suitable 12 to 14 bit converter of adequate speed for the specific application may be used. The digitized signal from the A/D converter is forwarded to the microprocessor unit 14 (MPU) for data processing.

The operation of the described system in conjunction with the MPU to attain the objectives of this invention may be described in detail as follows:

When an input voltage $V_S$ (say, 10.0 V) representing 100 percent transmittance is applied to the input of amplifier 12 and a fixed voltage $V_R$ (10.0 V) is applied to the input of the linear-log converter, 10, the output voltage $V_O$ will be 0.00 V representing a zero absorbance measurement.

As the input voltage or transmittance at the input decreases by one decade, ($V_S=1.00$ V and $V_R=10.0$ V), the output voltage $V_O$ will indicate 1.00 V or 1.00 absorbance.

As the input voltage decreases by another decade ($V_S=0.10$ V) the absorbance changes to 2.00 A.

For a system of dynamic range of five absorbance level, the maximum dynamic range of the linear-log converter need be only two absorbance in conjunction with the gain switching amplifier. To obtain a dynamic range of five absorbance units from a two decade linear-log converter the following process will occur:

As the input voltage or transmittance decreases and the output voltage $V_O$ or absorbance increases, say, to 2.001 A, the microcomputer detects the 2.001 A in digital form and automatically changes the gain of the amplifier 12 by one decade, i.e. to x10, thereby increasing the input voltage (transmittance) to the linear-log converter by a factor of ten and decreasing the output voltage (the indicated absorbance) by one decade back to 1.001 A. To correct the indicated absorbance value the MPU utilizes a look-up table and selects a proper absorbance readout of 2.001 A. This will then be the indicated value. To minimize the fluctuations caused by noise during the transition from one decade to the next, a delay or hysteresis loop may be included in the circuit.

Once again, as the transmittance decreases by another decade and the absorbance reaches a new value of 3.001 A, the MPU detects the 3.001 A and automatically changes the gain of the amplifier 12 by another decade, to x100, thereby increasing the input voltage to the linear-log converter by x100 and decreasing the output absorbance by two decades, from 3.001 to 1.001 A. At this time the MPU utilizes the look-up table again and indicates an absorbance of 3.001 A to the readout.

The same process takes place at 4.001 A for 4.001 A to 5.00 A. It will be apparent that the 2.001 absorbance as a switching point could be set at 3.001 or 4.001 to increase the dynamic range to 6 or 7 decades absorbance with deviation from the exact linear-log conversion characteristic being corrected digitally by the MPU from look-up tables. Therefore, the switching points or the dynamic range are preselectable under computer control.

For the above described operating sequence to function properly and accurately a calibration routine controlled by the MPU must initially be performed. This may be done when the instrument is started up or at any desired later time.

The calibration process takes place in a sequential form as follows:

1. Switch SW-1 is operated by the MPU command to apply a voltage of 10.0 V to the input of amplifier 12 via DAC-1, 32. The gain of amplifier 12 is set to unity by the MPU. The input to the reference side 16B of the linear-log converter 10 is a fixed voltage, also 10.0 V. The output of amplifier 24 is converted into digital form by the A/D converter 30 in conjunction with the MPU 4. Since the inputs to data and reference sides of amplifier 10 are both 10.0 V, the output should indicate 0.00 V zero absorbance. If the output indicates any value other than zero, the difference is registered in the MPU. This difference is added algebraically to the subsequent readings as an offset voltage correction. This offset voltage correction compensates for the differences between sample and reference voltages and also between the offset voltages of all the related amplifiers.

2. A voltage of 1.00 V is then applied via DAC-1, 32, to the input of amplifier 12 at unity gain; the output should as a result indicate 1.00 V or 1 A. If the output indicates other than 1.00 V (1.00 A), the difference is noted by the MPU and a multiplying factor is determined to apply to the data as a slope factor to make the output read exactly 1.00 V ie. 1.00 A.

3. The input voltage to amplifier 12 is then reduced by another decade via DAC-1, 32, the gain of amplifier 12 is switched from x1 to x10 by the MPU (assuming a five decades logarithmic operation), and the output of the A/D converter 30 is noted by the MPU. If the output is different from 1.00 V, a new multiplying factor is calculated as a slope factor for the gain setting of x10 of the amplifier 12.

4. The input voltage to amplifier 12 is further reduced two more decades via DAC-1, 32, in a similar sequential form and each time a new slope factor is calculated for each decade.

Therefore, any gain error caused by the amplifier 12 and the converter 10 is monitored and compensated for by the MPU. This calibration process eliminates the need for any manual calibration procedure since corrections for all variables and offsets are handled by the MPU as directed by appropriate software routines.

Although a certain particular embodiment of the invention has been herein disclosed for purposes of explanation, various modifications thereof, after study of the specification, will be apparent to those skilled in the art to which the invention pertains, and reference should accordingly be had to the appended claims in determining the scope of the invention.

What is claimed is:

1. A method comprising the steps of:
   introducing an analog data input signal into the input of a switchable variable gain instrumentation amplifier;
   introducing the output from said switchable variable gain isntrumentation amplifier into the data input of a linear-log converter, the output signal of which being a log function of the input signal;
   amplifying said output log signal in such a manner as to correct for the initial offset and for temperature drift;
   introducing said corrected log signal to the input of an analog to digital converter to digitize said corrected log signal;
   delivering said corrected digitized log signal subsequently to a microcomputer for examining the magnitude of said digitized log signal and for generating a command to switch the gain of said variable gain amplifier, if required, to such a commanded gain value that said digitized log signal magnitude does not exceed a preselected log value; and simultaneously delivering to a readout device a corrected log signal value which corresponds to said digitized log signal magnitude to which is added a value which is substantially the log of said commanded gain value, thus extending the range of said log signal as shown on the readout by the log of said commanded gain.

2. The method according to claim 1 wherein the variable gain amplifier includes switchable gain values comprising the series, X1, X10, X100, X1000.

3. The method according to claim 1 wherein, as an initial step, equal voltages are applied to the data and reference inputs of the linear-log converter and the microcomputer then stores the difference from zero volts of the voltage output from the analog/digital converter, if any, to be subsequently added to the analog/digital converter voltage output readings as an offset correction.

4. The method according to claim 1 wherein the magnitude of said corrected log signal at which said microcomputer is programmed to generate said switching command is determined by the microcomputer by comparison of said log signal with a value in a look-up table.

5. The method according to claim 1, wherein the microcomputer is programmed to determine and apply an overall slope factor for each gain setting of said variable gain amplifier as a correction to the readout signal.

6. A selectable dynamic range linear to logarithmic converter comprising, in combination:
   a programmable gain amplifier for amplifying a data input signal by a selected ratio;
   a linear-log converter for conversion of the output signal of said programmmable gain amplifier from linear to log form;
   a difference amplifier for canceling the initial voltage offset of the output log signal of said linear-log converter;
   an output amplifier for adjusting the level of said output log signal and providing temperature correction thereto;
   an analog to digital converter for converting the data signal output of said output amplifier to digitized form;
   a microcomputer programmed to supply commands to means for switching the gain of aid programmable gain amplifier in response to the level of said digitized data signal from said analog to digital converter to keep said data signal exactly within a predetermined signal level range; and
   said microcomputer also being programmed to supply said digitized data signal to a readout after determining, storing and providing calibration corrections for said signal.

7. The apparatus of claim 6 wherein said microcomputer programmed to supply commands to means for switching the gain of said programmable gain amplifier sets said programmable gain amplifier at unity gain for values of said readout signal covering a predetermined range of values.

8. The apparatus of claim 7 wherein said predetermined range of values includes zero to 2,000 Absorbance Units.

9. The apparatus of claim 7 wherein the gain is increased by a factor of 10 each time said readout signal increases by a predetermined amount in excess of said predetermined range.

10. The apparatus of claim 9 wherein said gain is increased by an additional factor of 10 each time said readout signal increases by an additioanl unit of absorbance.

* * * * *

UNITED STATES PATENT AND TRADEMARK OFFICE
CERTIFICATE OF CORRECTION

PATENT NO. : 4,679,162
DATED : July 7, 1987
INVENTOR(S) : Mortesa M. Chamran and Daniel J. Pisano, Jr.

It is certified that error appears in the above-identified patent and that said Letters Patent are hereby corrected as shown below: On the title page Please amend [75] Inventors, as follows:

Please delete line 1, "Alan Ferber, Hillside; Morteza M."

and insert in place thereof --Daniel J. Pisano, Jr.,

Barrington; Morteza M.--.

Signed and Sealed this

Eleventh Day of October, 1988

Attest:

DONALD J. QUIGG

Attesting Officer

Commissioner of Patents and Trademarks